United States Patent
Kim

(10) Patent No.: US 10,790,344 B2
(45) Date of Patent: Sep. 29, 2020

(54) DISPLAY DEVICE AND METHOD FOR MANUFACTURING THE SAME

(71) Applicant: LG Display Co., Ltd., Seoul (KR)

(72) Inventor: Hongsuk Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/204,423

(22) Filed: Nov. 29, 2018

(65) Prior Publication Data

US 2019/0181207 A1 Jun. 13, 2019

(30) Foreign Application Priority Data

Dec. 8, 2017 (KR) .................... 10-2017-0168330

(51) Int. Cl.
| | |
|---|---|
| H01L 27/32 | (2006.01) |
| H01L 29/786 | (2006.01) |
| H01L 29/423 | (2006.01) |
| H01L 27/12 | (2006.01) |
| H01L 29/66 | (2006.01) |
| H01L 51/52 | (2006.01) |

(52) U.S. Cl.
CPC ...... *H01L 27/3262* (2013.01); *H01L 27/1225* (2013.01); *H01L 27/1288* (2013.01); *H01L 27/3246* (2013.01); *H01L 27/3258* (2013.01); *H01L 27/3276* (2013.01); *H01L 29/42384* (2013.01); *H01L 29/66969* (2013.01); *H01L 29/7869* (2013.01); *H01L 29/78618* (2013.01); *H01L 29/78633* (2013.01); *H01L 29/78648* (2013.01); *H01L 27/3213* (2013.01); *H01L 51/5253* (2013.01); *H01L 2227/323* (2013.01)

(58) Field of Classification Search
CPC combination set(s) only.
See application file for complete search history.

(56) References Cited

U.S. PATENT DOCUMENTS

2012/0235156 A1* 9/2012 Kuraguchi ........ H01L 29/42316
257/76
2015/0014641 A1* 1/2015 Jung ................... H01L 27/1237
257/40

* cited by examiner

*Primary Examiner* — Ratisha Mehta
(74) *Attorney, Agent, or Firm* — Morgan, Lewis & Bockius LLP

(57) ABSTRACT

A display device and a method of manufacturing the same are provided. A display device includes: a substrate, a semiconductor layer on the substrate, a gate insulating pattern on the semiconductor layer, a plurality of gate electrodes on the gate insulating pattern, and a thin-film transistor spaced apart from the gate insulating pattern, the thin-film transistor including: a source electrode contacting the top surface of the semiconductor layer, a source-drain electrode adjacent to the source electrode, a first of the plurality of gate electrodes being between the source-drain electrode and the source electrode, and a drain electrode adjacent to the source-drain electrode, a second of the plurality of gate electrodes being between the drain electrode and the source-drain electrode.

14 Claims, 20 Drawing Sheets

DISPLAY DEVICE AND METHOD FOR MANUFACTURING THE SAME

CROSS-REFERENCE TO RELATED APPLICATION(S)

This application claims the benefit of and priority to Korean Patent Application No. 10-2017-0168330, filed on Dec. 8, 2017, the entirety of which is hereby incorporated by reference.

BACKGROUND

1. Technical Field

The present disclosure relates to a display device and a method for manufacturing the same, and more particularly, to a display device that can reduce the number of manufacturing masking steps and improve the characteristics of thin-film transistors and a method for manufacturing the same.

2. Discussion of the Related Art

With the development of the information society, various demands for display devices for displaying images are on the rise. In the field of display devices, flat panel display devices (FPDs), which are thin, lightweight, and can cover a large area, have been rapidly replacing cathode ray tubes (CRTs), which are bulky. The flat panel display devices include liquid crystal displays (LCDs), plasma display panels (PDPs), organic light-emitting displays (OLEDs), electrophoretic displays (EDs), etc.

Among these types of displays, the organic light-emitting displays are self-luminous devices, and have fast response time, high light emission efficiency, great brightness, and wide viewing angles. Notably, the organic light-emitting displays can be fabricated on a flexible plastic substrate, and have advantages over plasma display panels or inorganic light-emitting displays in that they can operate at a low voltage, have lower power consumption, and deliver vivid color reproduction, as compared to plasma display panels or inorganic electroluminescence (EL) displays.

An organic light-emitting display may largely comprise a plurality of thin-film transistors and organic light-emitting diodes that emit light. The thin-film transistors and the organic light-emitting diodes are manufactured through a photolithography process using a plurality of masks. A lot of layered elements are required to configure the thin-film transistors, which increases the size of the thin-film transistors. Moreover, a number of masks are used to make the thin-film transistors and the organic light-emitting diodes, which decreases productivity and increases the manufacturing costs.

SUMMARY

Accordingly, embodiments of the present disclosure are directed to a display device and a method of manufacturing the same that substantially obviate one or more of the issues due to limitations and disadvantages of the related art.

An aspect of the present disclosure is to provide a display device that can reduce the number of masks and improve the characteristics of thin-film transistors and a method for manufacturing the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a display device, including: a substrate, a semiconductor layer on the substrate, a gate insulating pattern on the semiconductor layer, a plurality of gate electrodes on the gate insulating pattern, and a thin-film transistor spaced apart from the gate insulating pattern, the thin-film transistor including: a source electrode contacting the top surface of the semiconductor layer, a source-drain electrode adjacent to the source electrode, a first of the plurality of gate electrodes being between the source-drain electrode and the source electrode, and a drain electrode adjacent to the source-drain electrode, a second of the plurality of gate electrodes being between the drain electrode and the source-drain electrode.

In another aspect, there is provided a method for manufacturing a display device, the method including: providing a semiconductor layer on a substrate, providing a gate insulating film on the semiconductor layer, depositing a gate electrode material on the substrate where the gate insulating film is provided, forming a plurality of gate electrodes using a single mask, providing a source electrode in contact with a first side of the semiconductor layer, providing a drain electrode in contact with a second side of the semiconductor layer, and providing a source-drain electrode between each of the plurality of gate electrodes.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

Figure 1:
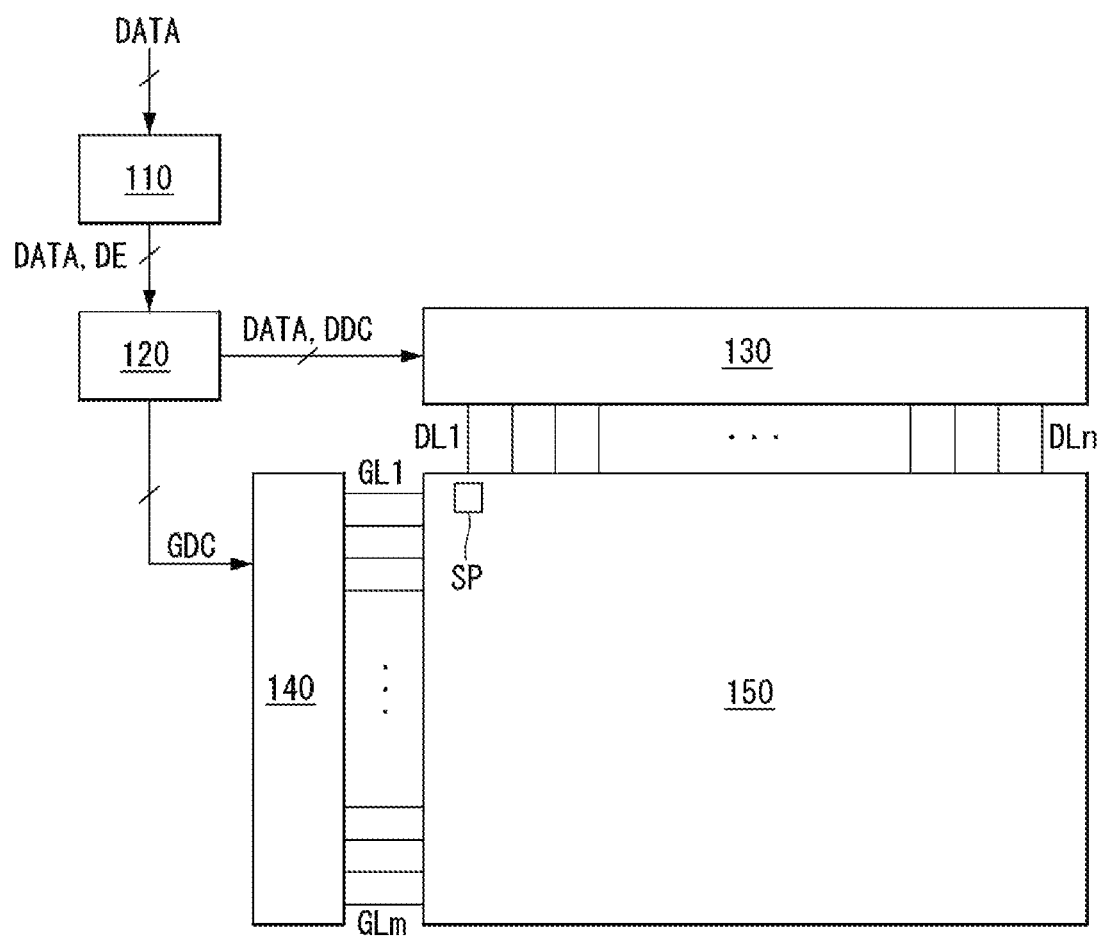
FIG. 1 is a block diagram of an organic light-emitting display.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used.

In describing a time relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Hereinafter, example embodiments of the present disclosure will be described in detail with reference to the accompanying drawings.

A display device according to an example embodiment of the present disclosure may be a micro-display, which may be 1.5 inches or less in size, and may require magnification or projection to allow the user to view the screen. The micro-display may require magnification or other optical elements to allow the user to view the screen. The micro-display may be advantageous in that it has highly-mobile electrons by having liquid crystals or organic light-emitting diodes on a silicon wafer (Si-wafer). Thus, a circuit with good quality in both the on and off states may be manufactured.

A display device according to an example embodiment of the present disclosure may be a display device in which display elements may be formed on a glass substrate or flexible substrate. Although examples of the display device include an organic light-emitting display, a liquid-crystal display, and an electrophoretic display, etc., the present disclosure will be described with respect to an organic light-emitting display. The organic light-emitting display comprises an organic layer formed of organic materials situated between a first electrode as an anode, and a second electrode as a cathode. A hole from the first electrode and an electron from the second electrode recombine within the organic layer, forming an exciton, e.g., a hole-electron pair. Then, energy may be created as the exciton returns to the ground state, thereby causing the self-luminous display to emit light.

Figure 2:
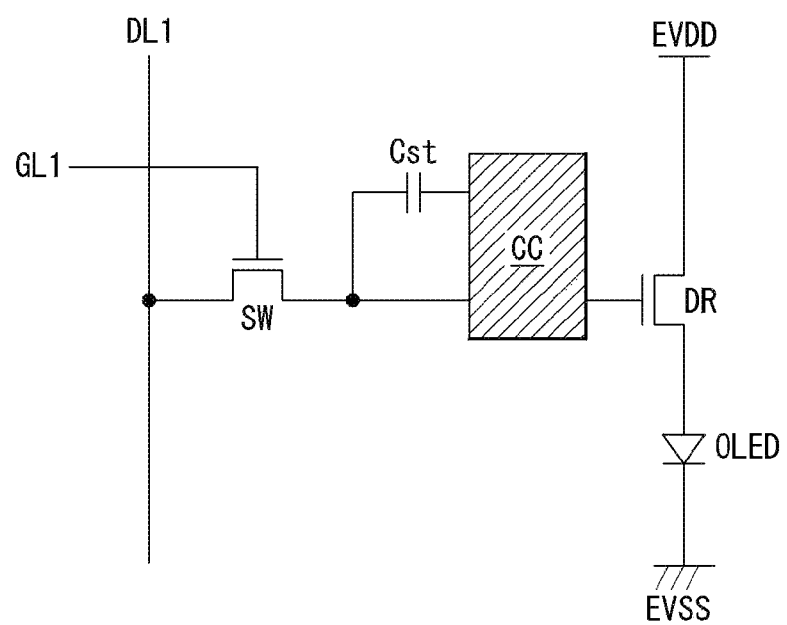
FIG. 2 is a circuit diagram of a subpixel.
Figure 3:
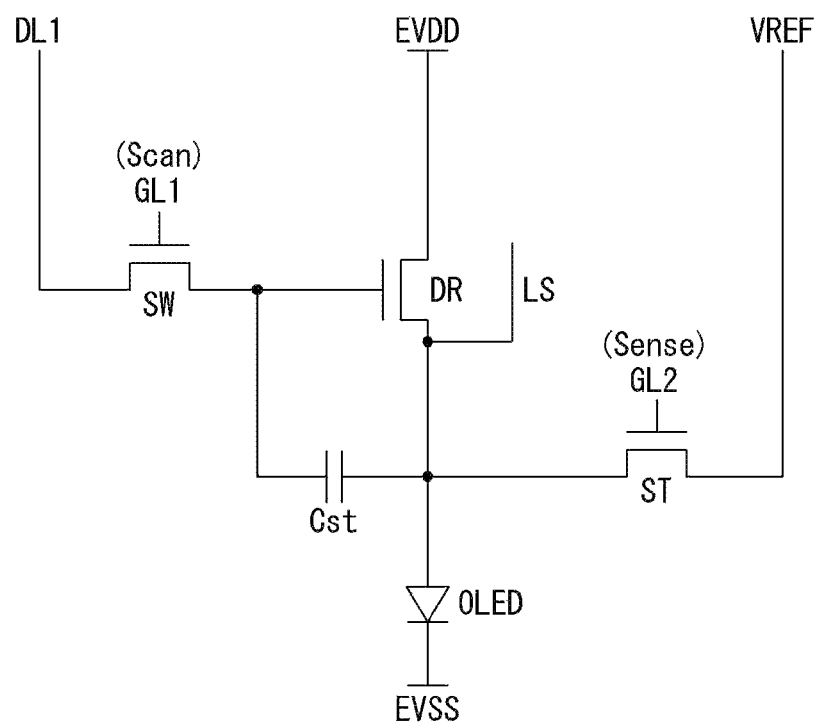
FIG. 3 is a detailed circuit diagram of a subpixel.

FIG. 1 is a block diagram of an organic light-emitting display. FIG. 2 is a circuit diagram of a subpixel. FIG. 3 is a detailed circuit diagram of a subpixel.

With reference to FIG. 1, an organic light-emitting display may include an image processor 110, a timing controller 120, a data driver 130, a scan driver 140, and a display panel 150. The image processor 110 may output a data enable signal DE, etc., along with an externally supplied data signal DATA. The image processor 110 may output one or more among a vertical synchronization signal, horizontal synchronization signal, and clock signal, in addition to the data enable signal DE, but these signals may be not shown in the drawings for convenience of explanation.

The timing controller 120 may receive the data signal DATA from the image processor 110, along with the data enable signal DE or driving signals including the vertical synchronization signal, horizontal synchronization signal, and clock signal. Based on the driving signals, the timing controller 120 may output a gate timing control signal GDC for controlling the operation timing of the scan driver 140, and a data timing control signal DDC for controlling the operation timing of the data driver 130.

In response to the data timing control signal DDC supplied from the timing controller 120, the data driver 130 may sample and latch the data signal DATA supplied form the timing controller 120, may convert it to a gamma reference voltage, and may output the gamma reference voltage. The data driver 130 may output the data signal DATA through data lines DL1 to DLn. The data driver 130 may be provided in the form of an integrated circuit (IC).

In response to the gate timing control signal GDC supplied from the timing controller 120, the scan driver 140 may output a scan signal. The scan driver 140 may output the scan signal through gate lines GL1 to GLm. The scan driver 140 may be provided in the form of an IC, or may be provided on the display panel 150 by a gate-in-panel (GIP) technology.

The display panel 150 may display an image, corresponding to the data signal DATA, and may scan signals respectively supplied from the data driver 130 and scan driver 140. The display panel 150 may include subpixels SP that may display an image.

The subpixels SP may include red subpixels, green subpixels, and blue subpixels, or may include white subpixels, red subpixels, green subpixels, and blue subpixels. Embodiments are not limited to these examples. The subpixels SP may have one or more emission areas, depending on their emission characteristics.

As shown in FIG. 2, each subpixel SP may include a switching transistor SW, a driving transistor DR, a capacitor Cst, a compensation circuit CC, and an organic light-emitting diode OLED. In response to a scan signal supplied through the first gate line GL1, the switching transistor SW may be switched on so that a data signal supplied through the first data line DL1 may be stored as a data voltage in a capacitor Cst. The driving transistor DR may operate in response to the data voltage stored in the capacitor Cst so that a driving current may flow between a power supply line EVDD (high-level voltage) and a cathode power supply line EVSS (low-level voltage). The organic light-emitting diode OLED may operate to emit light by the driving current provided by the driving transistor DR.

The compensation circuit CC may be a circuit that may be added into the subpixel to compensate for the threshold voltage, etc. of the driving transistor DR. The compensation circuit CC may include one or more transistors. The compensation circuit CC may have a wide variety of configurations, depending on the compensation method, so a detailed illustration and description of this will be omitted.

As shown in FIG. 3, the compensation circuit CC may include a sensing transistor ST and a sensing line VREF (or a reference line). The sensing transistor ST may be connected between a source electrode of the driving transistor DR and the anode (hereinafter, "sensing node") of the organic light-emitting diode OLED. The sensing transistor ST may operate to supply a reset voltage (or sensing voltage) delivered through the sensing line VREF to the sensing node of the driving transistor DR, or may sense a voltage or current at the source node of the driving transistor DR or at the sensing line VREF.

A first electrode of the switching transistor SW may be connected to the first data line DL1, and a second electrode of the switching transistor SW may be connected to a gate electrode of the driving transistor DR. A first electrode of the driving transistor DR may be connected to the power supply line EVDD, and a second electrode of the driving transistor DR may be connected to the anode of the organic light-emitting diode OLED. A first electrode of the capacitor Cst may be connected to the gate electrode of the driving transistor DR, and a second electrode of the capacitor Cst may be connected to the anode of the organic light-emitting diode OLED. The anode of the organic light-emitting diode OLED may be connected to the second electrode of the driving transistor DR, and the cathode of the organic light-emitting diode OLED may be connected to the power supply line EVSS. A first electrode of the sensing transistor ST may be connected to the sensing line VREF, and a second electrode of the sensing transistor ST may be connected to the anode of the organic light-emitting diode OLED and the second electrode of the driving transistor DR.

The operating time of the sensing transistor ST may be similar or identical to the operating time of the switching transistor SW according to an external compensation algorithm (or the configuration of the compensation circuit). For example, the gate electrode of the switching transistor SW may be connected to the first gate line GL1, and the gate electrode of the sensing transistor ST may be connected to the second gate line GL2. In this case, a scan signal Scan may be transmitted to the first gate line GL1, and a sensing signal Sense may be transmitted to the second gate line GL2. In another example, the first gate line GL1 connected to the gate electrode of the switching transistor SW and the second gate line GL2 connected to the gate electrode of the sensing transistor ST may be connected to be shared.

The sensing line VREF may be connected to the data driver. In this case, the data driver may sense the sensing node of the subpixel in real time, for an image non-display period or for a period of N frames (N being an integer greater than or equal to 1), and may generate a sensing result. Meanwhile, the switching transistor SW and the sensing transistor ST may be turned on at the same time. In this case, a sensing operation through the sensing line VREF and a data output operation for outputting a data signal may be distinguished from each other based on a time division method of the data driver.

A digital data signal, an analog data signal, or a gamma voltage may be compensated for according to a sensing result. Also, a compensation circuit, which may generate a compensation signal (or compensation voltage) based on the sensing result, may be implemented within the data driver, within the timing controller, or as a separate circuit.

A light shielding layer LS may be provided only under the channel region of the driving transistor DR, or may be provided under the channel regions of the switching transistor SW and sensing transistor ST, as well as under the channel region of the driving transistor DR. The light shielding layer LS may be used to simply block external light or may be used as an electrode that facilitates a connection to other electrodes or lines, and may constitute a capacitor, etc. Therefore, the light shielding layer LS may include multiple layers of metals (e.g., multiple layers of different metals) to have light shielding properties.

Besides, although FIG. 3 illustrates an example in which each subpixel has a three transistor (3T), one capacitor (1C) structure including a switching transistor SW, a driving transistor DR, a capacitor Cst, an organic light-emitting diode OLED, and a sensing transistor ST, each pixel may have various alternative structures, such as 3T2C, 4T2C, 5T1C, 6T2C, etc. For example, other structures may be used if the compensation circuit CC is added to the subpixel.

Figure 4:
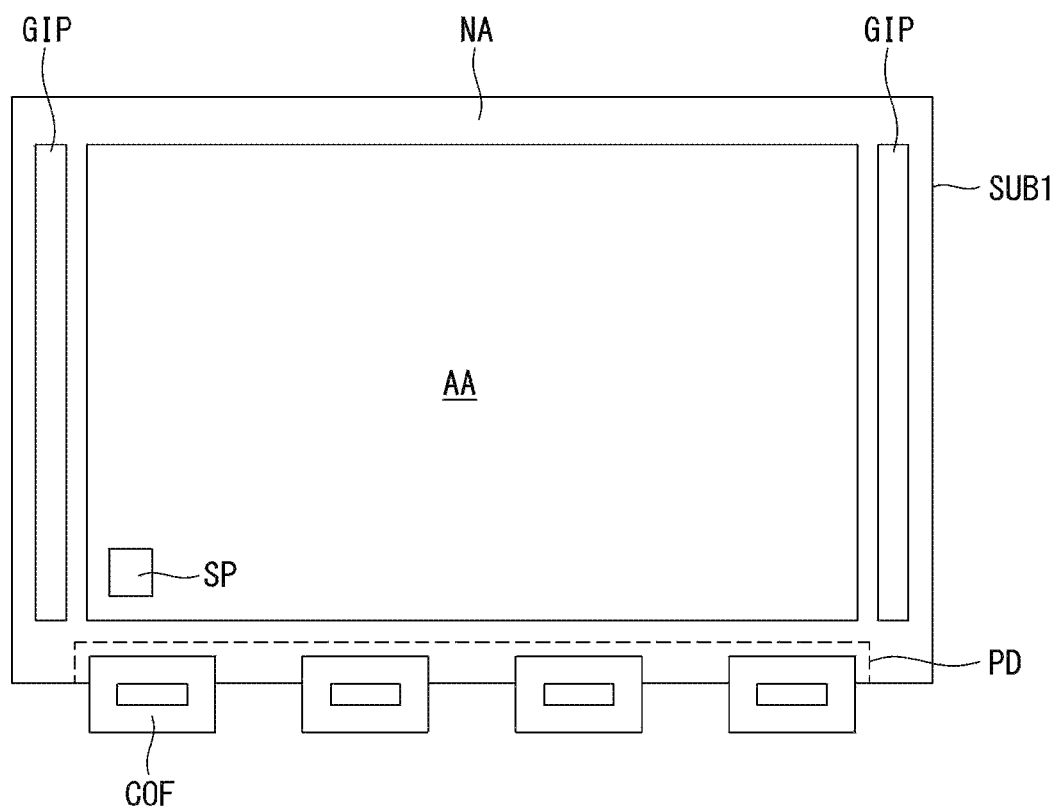
FIG. 4 is a top plan view showing an organic light-emitting display according to an example embodiment of the present disclosure.
Figure 5:
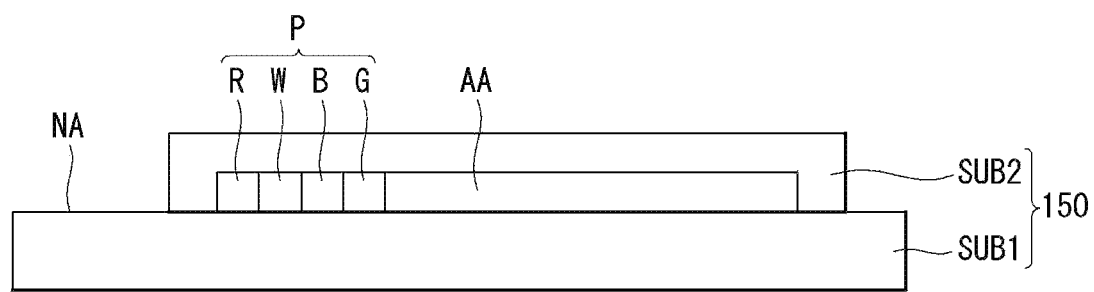
FIG. 5 is a cross-sectional view showing a structure of a display device according to an example embodiment of the present disclosure.
Figure 6:
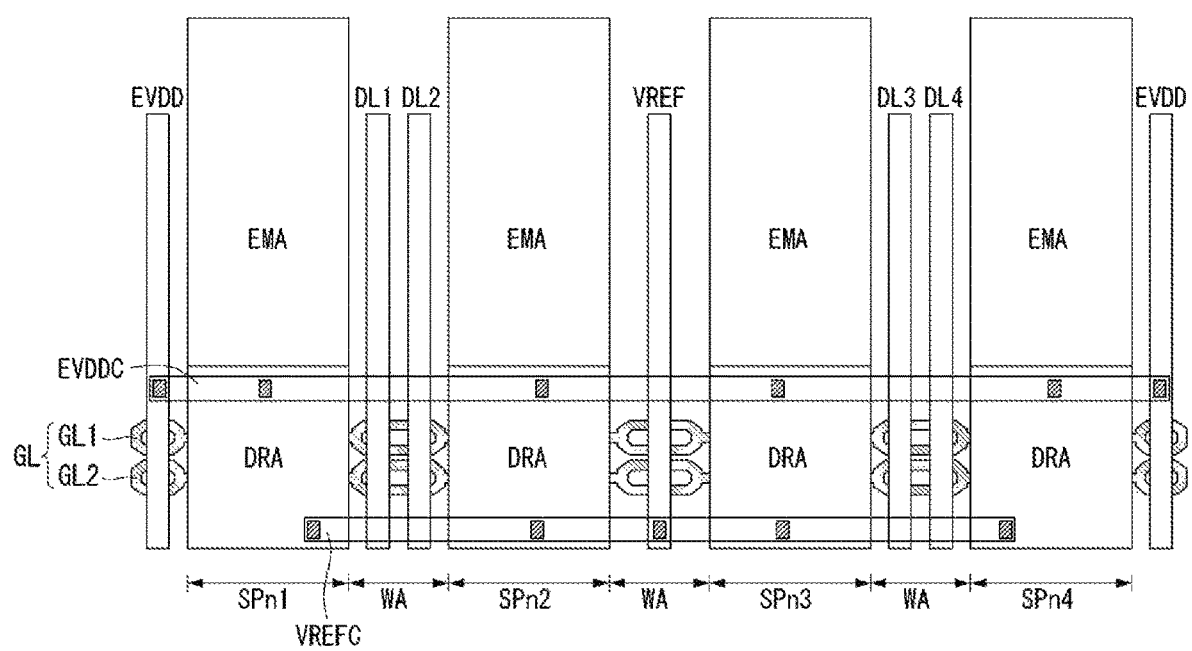
FIG. 6 is a view showing a planar layout of a subpixel according to an example embodiment of the present disclosure.

FIG. 4 is a top plan view showing an organic light-emitting display according to an example embodiment of the present disclosure. FIG. 5 is a cross-sectional view showing a structure of a display device according to an example embodiment of the present disclosure. FIG. 6 is a view showing a planar layout of a subpixel according to an example embodiment of the present disclosure.

With reference to FIG. 4, the organic light-emitting display may include a display area AA and a non-display area NA, which may be on a substrate SUB1. The non-display area NA may include GIP drivers GIP placed at the left and right sides of the substrate SUB1, and a pad portion PD placed at the bottom of the substrate SUB1. A plurality of subpixels SP may be located in the display area A/A and emit R, G, and B or R, G, B, and W to represent full colors. The GIP drivers GIP apply a gate driving signal to the display area A/A. The pad portion PD may be at one side of the display area A/A, for example, at the bottom side, and chip-on-films COF may be bonded to the pad portion DP. Data signals and electric power may be applied through the chip-on-films COF to a plurality of signal lines (not shown) connected to form the display area A/A.

As shown in FIG. 5, subpixels may be formed in the display area AA of the substrate (or thin-film transistor substrate) SUB1 based on the circuit described with reference to FIG. 3. The subpixels in the display area AA may be sealed by a passivation film (or passivation substrate) SUB2. The reference numeral "NA" denotes a non-display area. The substrate SUB1 may include glass or a ductile material, although embodiments are not limited thereto.

The subpixels may be horizontally or vertically arranged, for example, in the order of red (R), white (W), blue (B) and green (G) subpixels in the display area AA. Subpixels of red (R), white (W), blue (B), and green (G) may constitute a single pixel P. However, the arrangement order of the subpixels may be changed in various manners according to emission materials, emission areas, compensation circuit configurations (structures), etc. Furthermore, subpixels of red (R), blue (B), and green (G) may constitute a single pixel P.

As shown in FIGS. 5 and 6, first to fourth subpixels SPn1 to SPn4, each having an emitting region EMA and a circuit region DRA, may be formed in the display area AA of the substrate SUB1. An organic light-emitting diode (light-emitting element; OLED) may be formed in the emitting region EMA, and a circuit including the switching, sensing, and driving transistors for driving the organic light-emitting diode may be formed in the circuit region DRA. In the first to fourth subpixels SPn1 to SPn4, the OLED in the emitting region EMA may emit light in response to operations of the switching and driving transistors in the circuit region DRA. "WA" between each of the first to fourth subpixels SPn1 to SPn4 may be a wiring area in which the power supply line EVDD, sensing line VREF, and first to fourth data lines DL1 to DL4 may be arranged. The first and second gate lines GL1 and GL2 may extend across the first to fourth subpixels SPn1 to SPn4.

The electrodes constituting a thin-film transistor, as well as the wiring lines, such as the power supply line EVDD, sensing line VREF, and first to fourth data lines DL1 to DL4, may be on different layers, but may be electrically connected due to contact via a contact hole (via hole). The sensing line VREF may be connected to the sensing transistors (not shown) of the first to fourth subpixels SPn1 to SPn4 through a sensing connection line VREFC. The power supply line EVDD may be connected to the driving transistors (not shown) of the first to fourth subpixels SPn1 to SPn4 through a power supply connection line EVDDC. The first and second gate lines GL1 and GL2 may be connected to the sensing and switching transistors (not shown) of the first to fourth subpixels SPn1 to SPn4.

Figure 7:
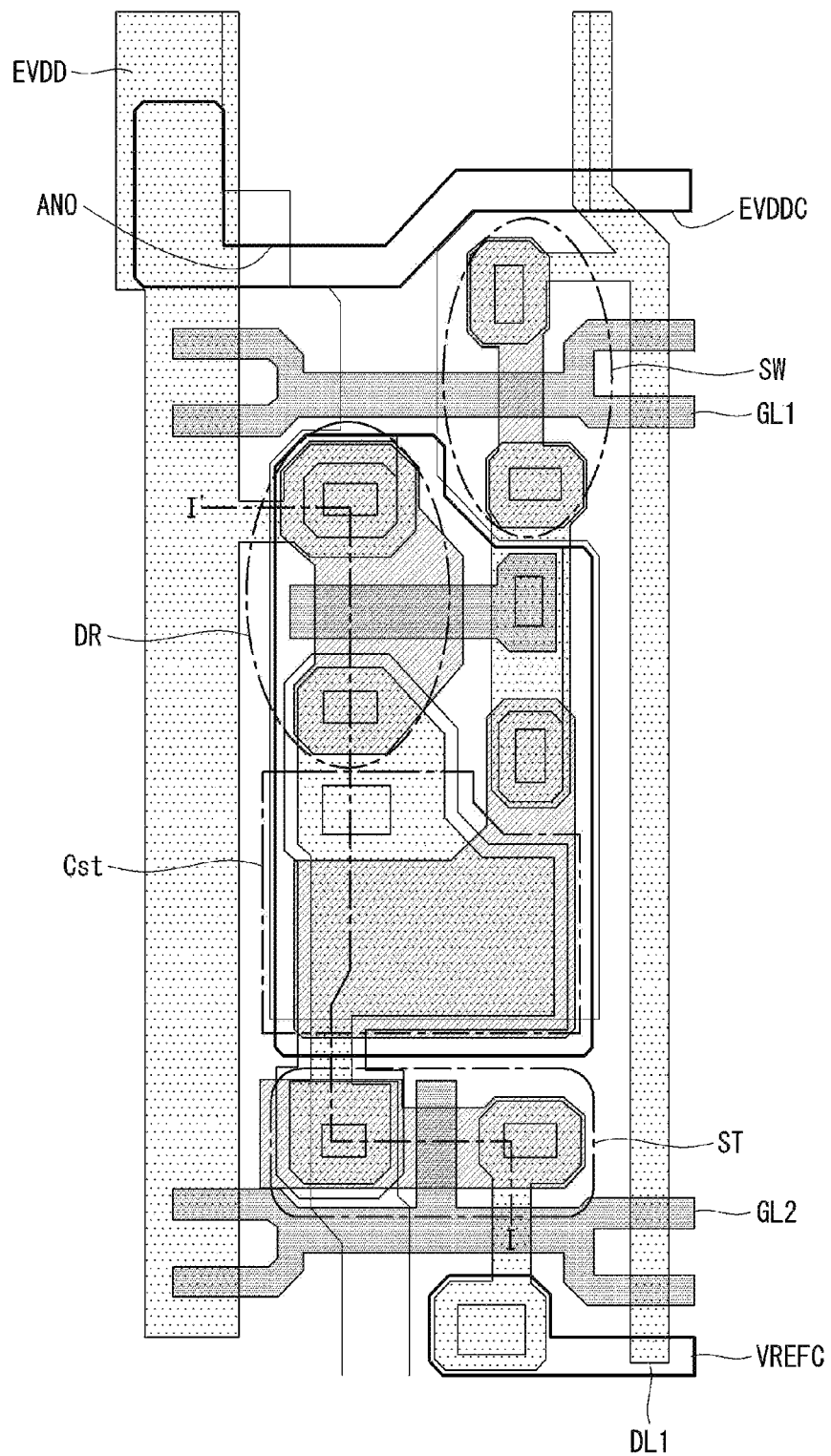
FIG. 7 is a view showing in more details a circuit region in FIG. 6.
Figure 8:
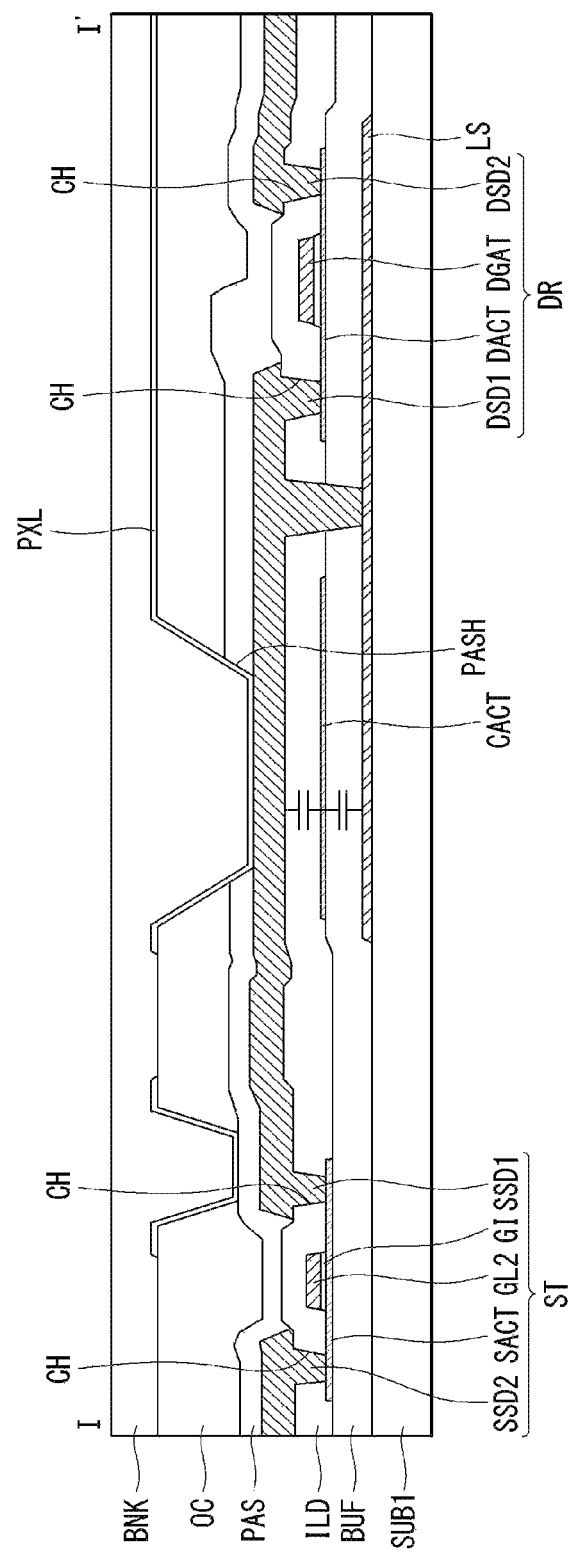
FIG. 8 is a cross-sectional view taken along line I-I' of FIG. 7.

FIG. 7 is a view showing in more details a circuit region in FIG. 6. FIG. 8 is a cross-sectional view taken along line I-I' of FIG. 7.

With reference to FIGS. 6 and 7, the first subpixel SPn1 may be defined by the intersection of the first and second gate lines GL1 and GL2 and the first data line DL1. The first subpixel SPn1 may include a driving transistor DR, a sensing transistor ST, a switching transistor SW, a capacitor Cst, and an organic light-emitting diode OLED.

The first electrode ANO of the organic light-emitting diode OLED may be located in the emitting region EMA. The driving transistor DR, capacitor Cst, sensing transistor ST, and switching transistor SW may be located in the circuit region DRA. The sensing connection line VREFC, connected from the sensing line VREF as shown in FIG. 6, may be connected to the sensing transistor ST.

A cross-sectional structure of the sensing transistor ST, driving transistor DR, and capacitor Cst will be described below with reference to FIG. 8. The sensing transistor ST, the capacitor Cst, and the driving transistor DR may be on the substrate SUB1. The light shielding layer LS may be on the substrate SUB1, and may overlap the capacitor Cst and the channel of the driving transistor DR. A buffer layer BUF may be on the entire surface of the substrate SUB1, including the light shielding layer LS.

A first semiconductor layer SACT, the second gate line GL2 (a first gate electrode), a first source electrode SSD1, and a first drain electrode SSD2 may be in some part of the buffer layer BUF to constitute the sensing transistor ST. A gate insulating film GI may be between the first semiconductor layer SACT and the second gate line GL2 to insulate them. An interlayer insulating film ILD may be on the second gate line GL2, and the first source electrode SSD1 and the first drain electrode SSD2 may be on the interlayer insulating film ILD. The interlayer insulating film ILD may include contact holes CH exposing part of the first semiconductor layer SACT. The first source electrode SSD1 and the first drain electrode SSD2 may be connected to the first semiconductor layer SACT by contacting the first semiconductor layer SACT via the contact holes CH.

A second semiconductor layer DACT, a second gate electrode DGAT, a second source electrode DSD1, and a second drain electrode DSD2 may be in some other part of the buffer layer BUF to constitute the driving transistor DR. The gate insulating film GI may be between the second semiconductor layer DACT and the second gate electrode DGAT to insulate them. The interlayer insulating film ILD may be on the second gate electrode DGAT, and the second source electrode DSD1 and the second drain electrode DSD2 may be on the interlayer insulating film ILD. The interlayer insulating film ILD may have contact holes CH exposing part of the second semiconductor layer DACT. The second source electrode DSD1 and the second drain electrode DSD2 may be connected to the second semiconductor layer DACT by contacting the second semiconductor layer DACT via the contact holes CH.

Meanwhile, the capacitor Cst may be between the sensing transistor ST and the driving transistor DR. In the capacitor Cst, the buffer layer BUF may be between the light shielding layer LS and an intermediate electrode CACT, thereby forming a capacitance. Also, in the capacitor Cst, the interlayer insulating film ILD may be between the intermediate electrode CACT and the second source electrode DSD1 of the driving transistor DR, thereby forming a capacitance. Thus, the capacitor Cst may act as a double-layered capacitor.

A passivation film PAS may be on the sensing transistor ST. The driving transistor DR, and the capacitor Cst, and an overcoat layer OC for planarizing them may be on the passivation film PAS. The overcoat layer OC and the passivation film PAS may have a passivation hole PASH that may expose the second source electrode DSD1 of the driving transistor DR. The first electrode PXL may be on the overcoat layer OC, and may be connected to the second source electrode DSD1 via the passivation hole PASH. A bank layer BNK for defining a pixel may be on the first electrode PXL. Although not shown, an emissive layer for emitting light and a second electrode may be on the bank layer BNK, thereby forming an organic light-emitting diode including the first electrode PXL, emissive layer, and second electrode.

In the above-described display device according to the structure of FIG. 8, it may be necessary to make the semiconductor layers conductive if the semiconductor layers include an oxide. However, only the regions that contact the source and drain electrodes may be made conductive, so the semiconductor layers cannot perform their function. Moreover, a total of eleven masks may be needed, including a light shielding layer, a semiconductor layer, a gate electrode, a contact hole, source and drain electrodes, a passivation hole (two masks), a first electrode, a bank layer, an emissive layer, and a second electrode, to manufacture the display device.

Hereinafter, an example embodiment of the present disclosure discloses a display device that can reduce the number of masks because an oxide semiconductor layer can be made conductive.

Example Embodiment

Figure 9:
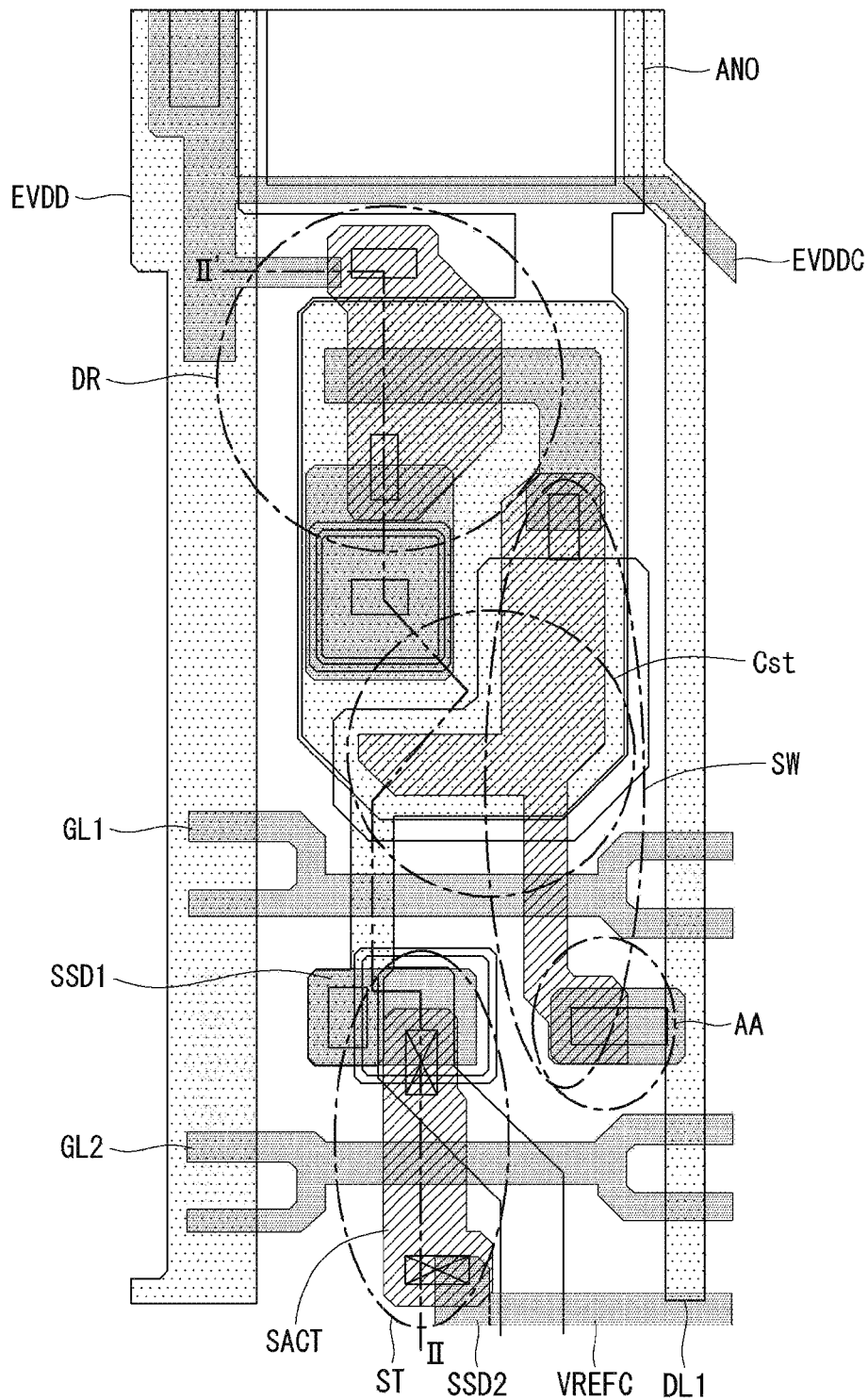
FIG. 9 is a view showing a planar structure of a subpixel in a display device according to an example embodiment of the present disclosure.
Figure 10:
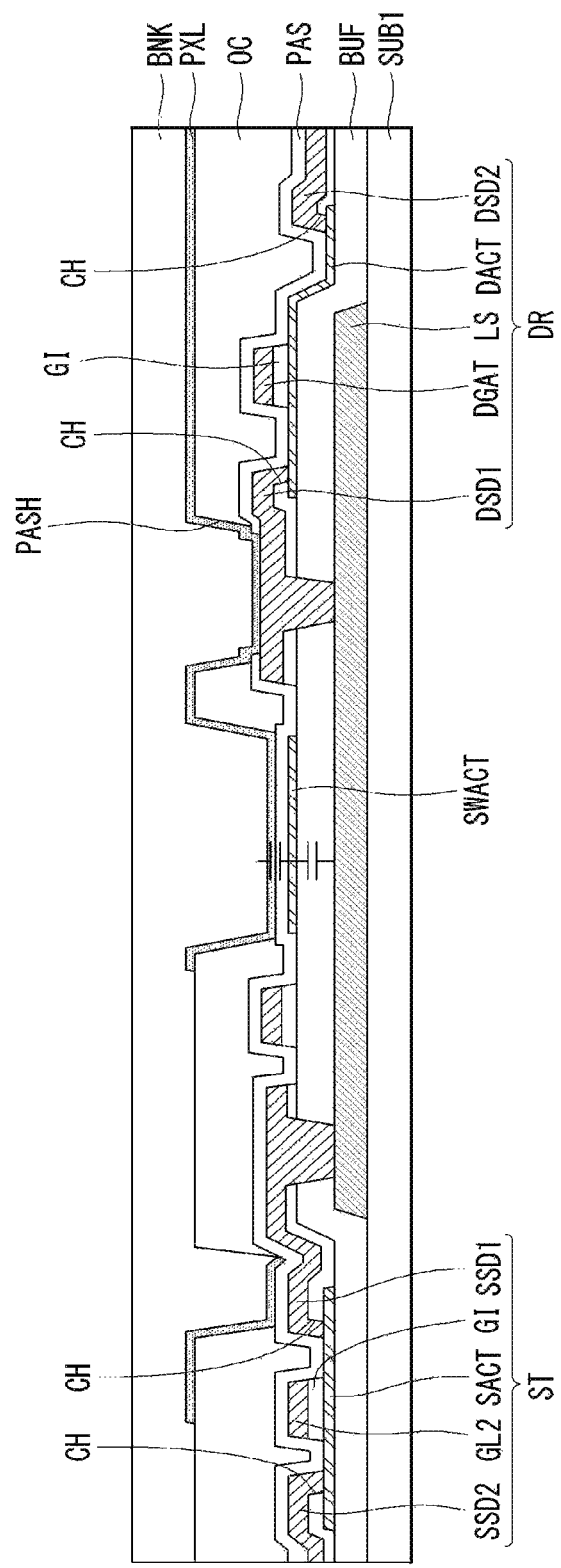
FIG. 10 is a cross-sectional view taken along line II-IF of FIG. 9.

FIG. 9 is a view showing a planar structure of a subpixel in a display device according to an example embodiment of the present disclosure. FIG. 10 is a cross-sectional view taken along line II-IF of FIG. 9.

With reference to FIGS. 6 and 9, the first subpixel SPn1 may be defined by the intersection of the first and second gate lines GL1 and GL2 and the first data line DL1. The first subpixel SPn1 may include a driving transistor DR, a sensing transistor ST, a switching transistor SW, a capacitor Cst, and an organic light-emitting diode OLED.

The first electrode ANO of the organic light-emitting diode OLED may be located in the emitting region EMA, and the driving transistor DR, capacitor Cst, sensing transistor ST, and switching transistor SW may be located in the circuit region DRA. For example, the sensing transistor ST may include a second gate line GL2 acting as a gate electrode, a first drain electrode SSD2, a first source electrode SSD1, and a first semiconductor layer SACT. The first drain electrode SSD2 of the sensing transistor ST may be formed integrally with the sensing connection line VREFC connected from the sensing line VREF shown in FIG. 6. In each subpixel shown in FIG. 9 according to an example embodiment of the present disclosure, horizontally-aligned lines, for example, the first and second gate lines GL1 and GL2, sensing connection line VREFC, and power supply connection line EVDDC may include a gate electrode material. Vertically aligned lines, for example, the first data line DL1 and the power supply line EVDD, may include a light shielding layer material.

A cross-sectional structure of the sensing transistor ST, driving transistor DR, and capacitor Cst will be described below with reference to FIG. 10. The sensing transistor ST, the capacitor Cst, and the driving transistor DR may be on the substrate SUB1. The light shielding layer LS may be on the substrate SUB1, and may overlap the capacitor Cst and the channel of the driving transistor DR. A buffer layer BUF may be on the entire surface of the substrate SUB1 including the light shielding layer LS.

A first semiconductor layer SACT, the second gate line GL2, a first source electrode SSD1, and a first drain electrode SSD2 may be in some part of the buffer layer BUF to constitute the sensing transistor ST. A gate insulating film GI may be between the first semiconductor layer SACT and the second gate line GL2 to insulate them. The gate insulating film GI may have contact holes CH exposing part of the first semiconductor layer SACT. The first source electrode SSD1 and the first drain electrode SSD2 may be connected to the first semiconductor layer SACT by contacting the first semiconductor layer SACT via the contact holes CH. The gate insulating film GI may also be between the first semiconductor layer SACT and the first source electrode SSD1, and between the first semiconductor layer SACT and the first drain electrode SSD2, and the first source electrode SSD1 and the first drain electrode SSD2 may directly contact the side and top surfaces of the gate insulating film GI. The second gate line GL2, first source electrode SSD1, and first drain electrode SSD2 may all be made of the same material. For example, the first source electrode SSD1 and the first drain electrode SSD2 may be formed simultaneously when the second gate line GL2 is formed of the material of the second gate line GL2.

A second semiconductor layer DACT, a second gate electrode DGAT, a second source electrode DSD1, and a second drain electrode DSD2 may be in some other part of the buffer layer BUF to constitute the driving transistor DR. The gate insulating film GI may be between the second semiconductor layer DACT and the second gate electrode DGAT to insulate them. The gate insulating film GI may have contact holes CH exposing part of the second semiconductor layer DACT. The second source electrode DSD1 and the second drain electrode DSD2 may be connected to the second semiconductor layer DACT by contacting the second semiconductor layer DACT via the contact holes CH. The gate insulating film GI may also be between the second semiconductor layer DACT and the second source electrode DSD1, and between the second semiconductor layer DACT and the second drain electrode DSD2, and the second source electrode DSD1 and the second drain electrode DSD2 may directly contact the side and top surfaces of the gate insulating film GI. The second gate electrode DGAT, the second source electrode DSD1, and the second drain electrode DSD2 may be all made of the same material, similarly to the sensing transistor ST.

Meanwhile, the capacitor Cst may be between the sensing transistor ST and the driving transistor DR. In the capacitor Cst, the buffer layer BUF may be between the light shielding layer LS and a third semiconductor layer SWACT of the switching transistor (not shown), thereby forming a capacitance. Also, in the capacitor Cst, a passivation film PAS may be between the third semiconductor layer SWACT of the switching transistor (not shown) and the first electrode PXL of the organic light-emitting diode, thereby forming a capacitance. Thus, the capacitor Cst may act as a double-layered capacitor.

The passivation film PAS may be on the sensing transistor ST, the driving transistor DR, and the capacitor Cst. The passivation film PAS may cover the aforementioned second gate line GL2, the first source electrode SSD1, the first drain electrode SSD2, the second gate electrode DGAT, the second source electrode DSD1, and the second drain electrode DSD2. The passivation film PAS may contact the second semiconductor layer DACT. The contact holes CH in the gate insulating film GI may be not filled with the second source electrode DSD1 and the second drain electrode DSD2, which creates an empty area and exposes the semiconductor layer DACT. Accordingly, the passivation film PAS may contact the second semiconductor layer DACT. Also, the passivation film PAS may contact the first semiconductor layer SACT. The contact holes CH in the gate insulating film GI may not be filled with the first source electrode SSD1 and the first drain electrode SSD2, which may create an empty area and expose the semiconductor layer SACT. Accordingly, the passivation film PAS may contact the first semiconductor layer SACT. An overcoat layer OC for planarizing them may be on the passivation film PAS. The overcoat layer OC and the passivation film PAS may have a passivation hole PASH that exposes the second source electrode DSD1 of the driving transistor DR. The first electrode PXL may be on the overcoat layer OC, and may be connected to the second source electrode DSD1 via the passivation hole PASH. A bank layer BNK for defining a pixel may be on the first electrode PXL. Although not shown, an emissive layer for emitting light and a second electrode may be on the bank layer BNK, thereby forming an organic light-emitting diode including the first electrode PXL, the emissive layer, and the second electrode.

FIGS. 11A to 11E are cross-sectional views showing each process of a method for manufacturing a subpixel in a display device according to an example embodiment of the present disclosure.

A manufacturing process of the above-described subpixel will be described below with reference to FIGS. 11A to 11E. Disclosed below is a cross-section structure, different from that of FIG. 10, that shows a driving transistor, a capacitor, a pad, and an organic light-emitting diode.

Figure 11A:
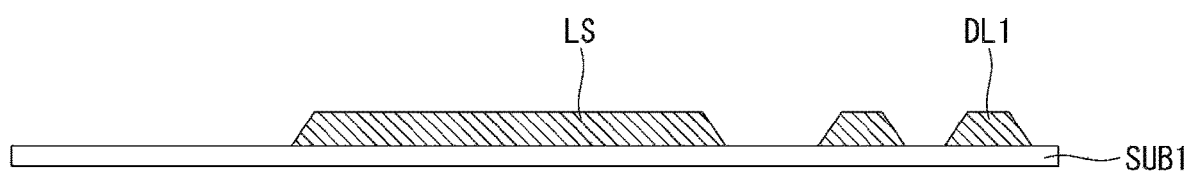
FIGS. 11A to 11E are cross-sectional views showing each process of a method for manufacturing a subpixel in a display device according to an example embodiment of the present disclosure.

With reference to FIG. 11A, a light shielding layer LS and a first data line DL1 may be formed on a substrate SUB1 using a first mask. The light shielding layer LS may shield light coming from the outside, and may prevent photocurrent from being generated in a thin-film transistor. The light shielding layer LS and the first data line DL1 may include the same material.

Figure 11B:
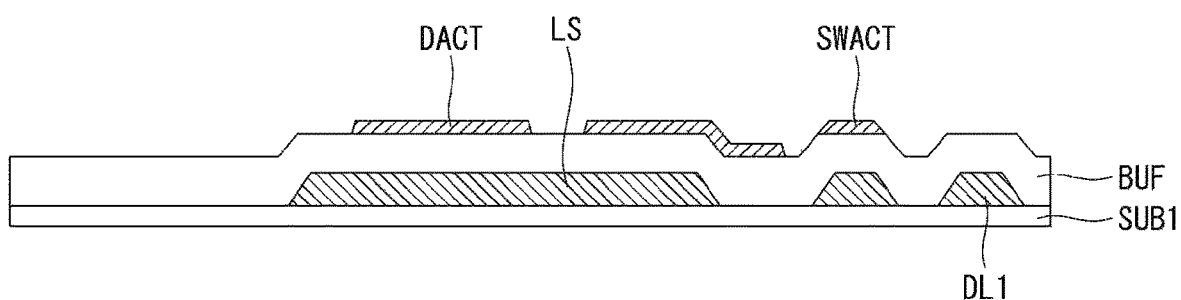

As shown in FIG. 11B, a buffer layer BUF may be formed on the entire surface of the substrate SUB1 where the light shielding layer LS may be provided. The buffer layer BUF may protect thin-film transistors formed in a subsequent process from impurities, such as alkali ions leaking out of the substrate SUB1. The buffer layer BUF may be, for example, a silicon oxide ($SiO_x$), a silicon nitride ($SiN_x$), or multiple layers of these compounds. Next, a second semiconductor layer DACT and a third semiconductor layer SWACT may be formed on the buffer layer BUF using a second mask. The second semiconductor layer DACT and the third semiconductor layer SWACT may include oxide semiconductor.

Figure 11C:
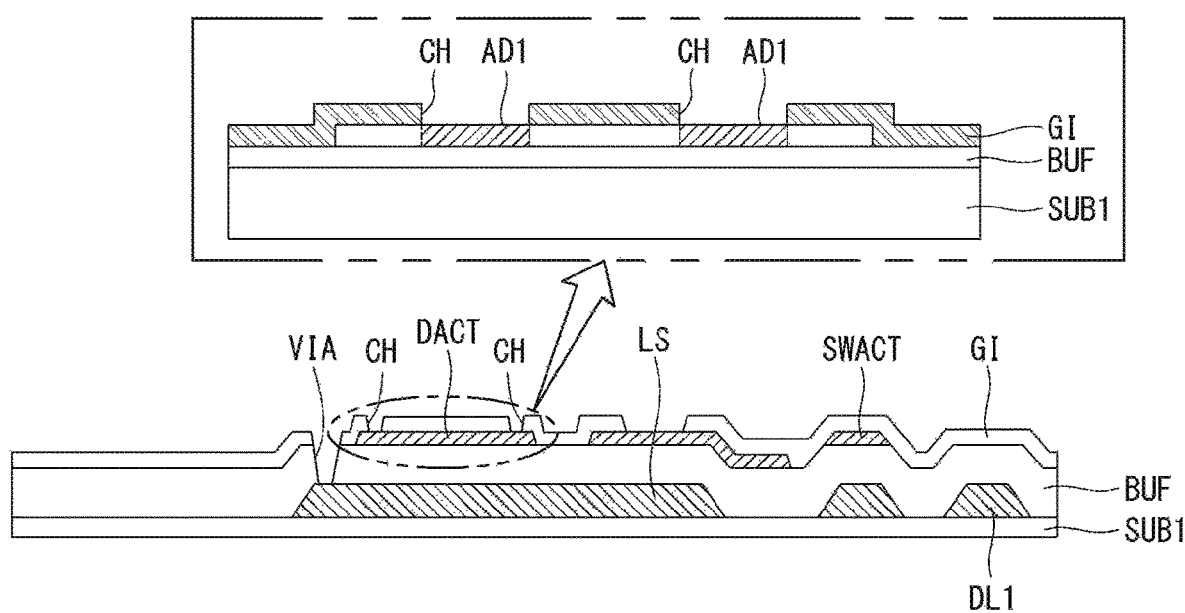

With reference to FIG. 11C, a gate insulating film GI may be deposited onto the entire surface of the substrate SUB1. Then, contact holes CH exposing the second semiconductor layer DACT and a via hole VIA exposing the light shielding layer LS may be formed using a half-tone mask as a third mask. In a dry etching process, in which the contact holes CH may be formed, the second semiconductor layer DACT may be doped with impurities by plasma, thereby forming a first conductive region AD1.

Figure 11D:
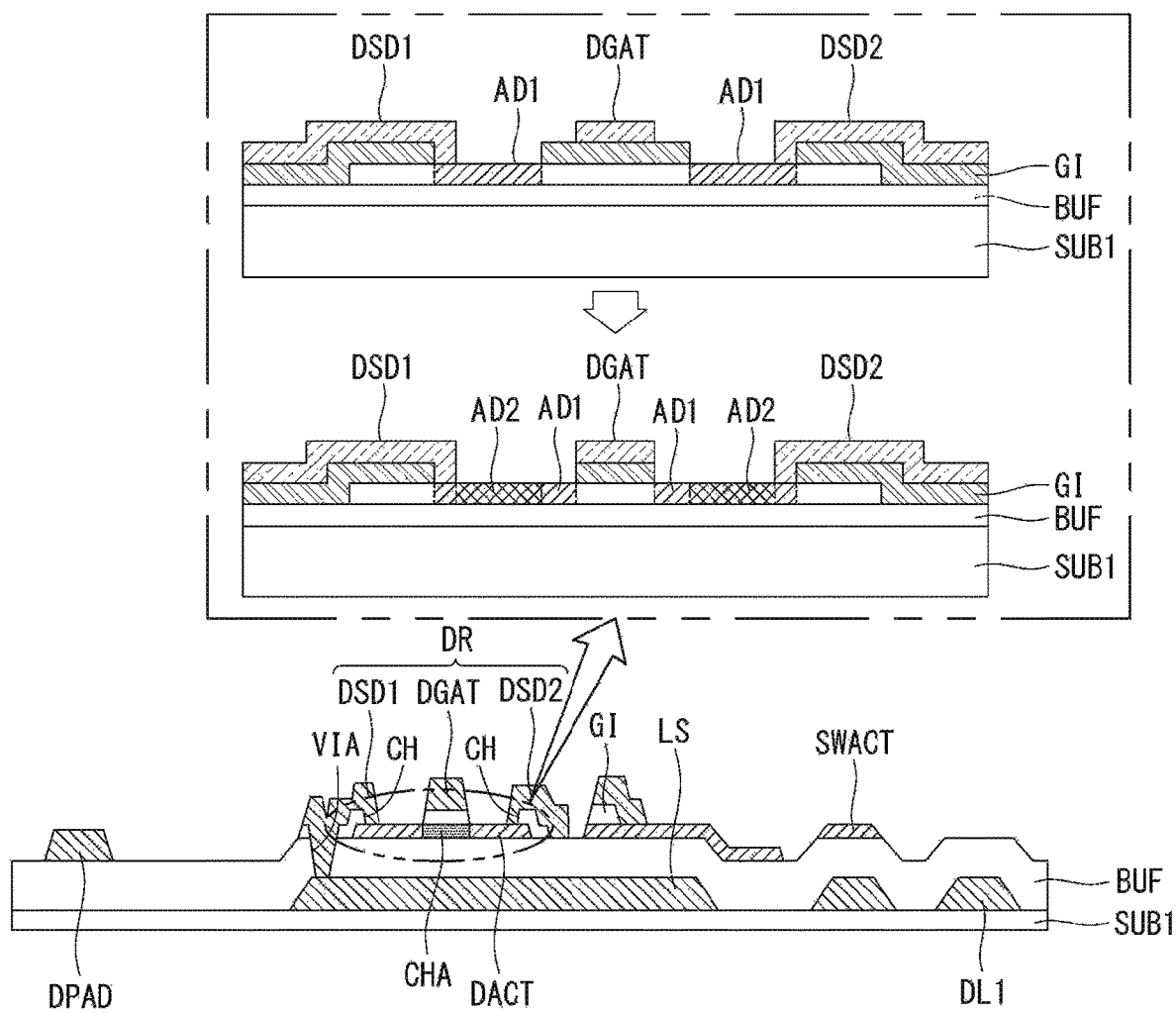

As shown in FIG. 11D, a gate electrode material may be deposited onto the substrate SUB1 where the gate insulating film GI may be formed, and then may be patterned using a fourth mask, thereby forming a second gate electrode DGAT, a second source electrode DSD1, a second drain electrode DSD2, and a data pad DPAD. The second source electrode DSD1 and the second drain electrode DSD2 may contact the second semiconductor layer DACT via the contact holes CH in the gate insulating film GI, and the second source electrode DSD1 may contact the light shielding layer LS via the via hole VIA.

Afterwards, the gate insulating film GI may be dry-etched using the second gate electrode DGAT as a mask to make the gate insulating film GI underlying the second gate electrode DGAT the same size as the second gate electrode DGAT. In this case, in the dry etching process, the second semiconductor layer DACT may be doped with impurities, e.g., with plasma. Thus, the second semiconductor layer DACT may have a second conductive region AD2, which may be formed by impurity doping, e.g., by performing the dry etching process two times, and the first conductive region AD1, which may be formed by impurity doping, e.g., by performing the dry etching process once. Then, a channel CHA corresponding to the second gate electrode DGAT may be formed in the second semiconductor layer DACT. Thus, the driving transistor DR and the data pad DPAD may be formed on the substrate SUB1.

The gate electrode material may include one or more of: molybdenum (Mo), aluminum (Al), chromium (Cr), gold (Au), titanium (Ti), nickel (Ni), neodymium (Nd), and copper (Cu), alloys of these elements, and/or alloys of these elements. Further, the gate electrode material may be a multilayer material, which may include two or more of: molybdenum (Mo), aluminum (Al), chromium (Cr), gold (Au), titanium (Ti), nickel (Ni), neodymium (Nd), copper (Cu), and/or alloys of these elements. For example, the gate electrode material may include dual layers of molybdenum and aluminum-neodymium or molybdenum and aluminum. Embodiments are not limited to these examples.

Figure 11E:
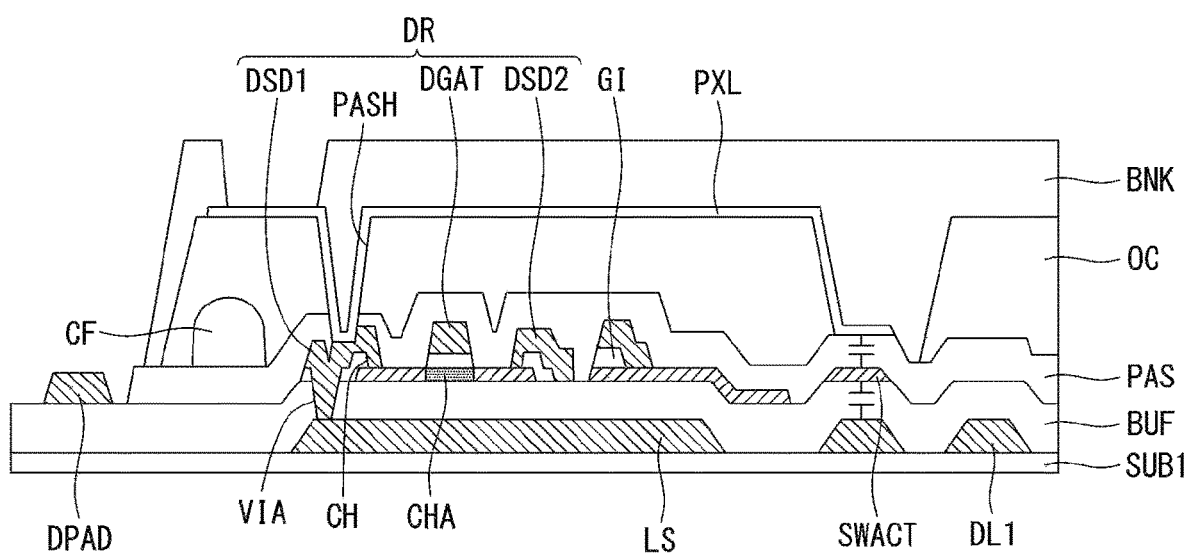

As shown in FIG. 11E, a passivation film PAS may be deposited onto the substrate SUB1 where the driving transistor DR and the data pad DPAD may be formed, and then a passivation hole PASH may be formed using a fifth mask. The passivation film PAS may contact the second semiconductor layer DACT via the contact holes CH. Next, a color filter CF may be formed, and then an overcoat layer OC may be formed. The overcoat layer OC may be a planarization film for smoothing out irregularities on the underlying structure, and may include an organic material, such as polyimide, a benzocyclobutene-based resin, acrylate, etc. Embodiments are not limited to these examples. A passivation hole PASH exposing the second source electrode DSD1 may be formed in some region of the overcoat layer OC using a sixth mask.

A first electrode PXL may be formed on the overcoat layer OC using a seventh mask. The first electrode PXL may be connected to the second source electrode DSD1 of the driving transistor DR via the passivation hole PASH. Moreover, part of the first electrode PXL, along with the third semiconductor layer SWACT of the switching transistor, may act as a capacitor Cst. A bank layer BNK may be formed on the first electrode PXL, and an open portion (not shown) may be formed in the subpixel using an eighth mask. Although not shown, an emissive layer may be formed on the bank layer BNK using a ninth mask, and a second electrode may be formed using a tenth mask.

The above-described display device manufactured according to the above-described example embodiment of the present disclosure has an advantage of using one less mask than the above-described display device of FIG. 8 because oxide thin-film transistors may be manufactured by making a semiconductor layer made of an oxide conductive and using a total of only ten masks. In contrast, eleven masks would be used in forming the example of FIG. 8.

Figure 12:
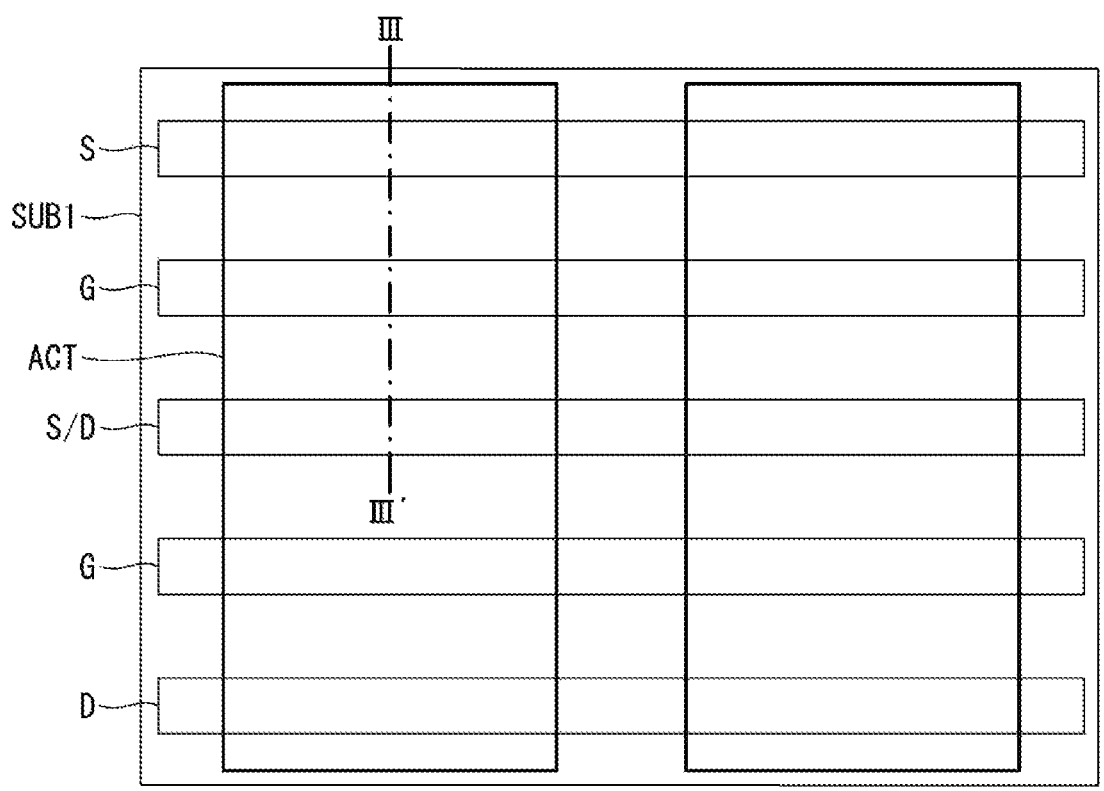
FIG. 12 is a top plan view showing a GIP driver of a display device according to an example embodiment of the present disclosure.
Figure 13:
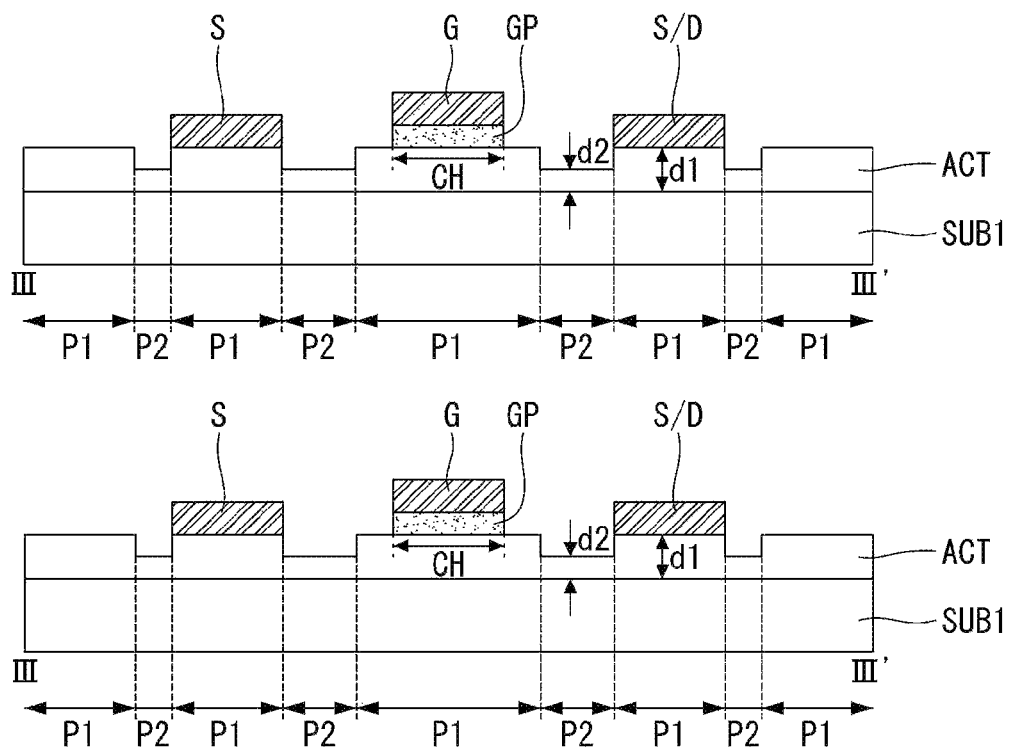
FIG. 13 is a cross-sectional view taken along line of FIG. 12.

FIG. 12 is a top plan view showing a GIP driver of a display device according to an example embodiment of the present disclosure. FIG. 13 is a cross-sectional view taken along line of FIG. 12.

The aforementioned GIP drivers GIP shown in FIG. 4 may include a scan driver and an emission driver, and the scan driver and the emission driver may each include a buffer TFT portion. In this example embodiment, the TFT structure of the GIP drivers GIP will be described by taking the structure of these buffer TFT portions as an example.

With reference to FIG. 12, a plurality of semiconductor layers ACT may be vertically arranged on a substrate SUB1, and a source electrode S, a gate electrode G, a source-drain electrode S/D, and a drain electrode D may be arranged on the semiconductor layers ACT. The source-drain electrode S/D is referred to as such herein because it may serve as a drain electrode with respect to the gate electrode G on the left side thereof or as a source electrode with respect to the gate electrode G on the right side thereof. For example, the source electrode S and the source-drain electrode S/D may be adjacent to each other on one side and the other side of the gate electrode G, respectively, with the gate electrode G on the left side of the source-drain electrode S/Din between. Also, the drain electrode D may be adjacent to the source-drain electrode S/D, with the gate electrode G on the right side of the source-drain electrode S/D in between. It should be appreciated that the terms "left" and "right" may be used interchangeably, and are used herein for convenience of explanation. While this example embodiment illustrates two gate electrodes G, one source electrode S, one source-drain electrode S/D, and one drain electrode D, more electrodes may be arranged.

For example, with reference to FIG. 13, a semiconductor layer ACT may be on the substrate SUB1, and a gate insulating pattern GP may be on some part of the semiconductor layer ACT. A gate electrode G may be on the gate insulating pattern GP. The source electrode S and the source-drain electrode S/D may be on the top surface of the semiconductor layer ACT by contacting the top surface of the semiconductor layer ACT. For example, the entire bottom surfaces of the source electrode S and source/drain electrode S/D may contact the top surface of the semiconductor layer ACT. Although not shown, the entire bottom surface of the drain electrode D may also contact the top surface of the semiconductor layer ACT. The gate electrode G, the source electrode S, the source-drain electrode S/D, and the drain electrode D may include a gate electrode material.

The aforementioned source electrode S, source-drain electrode S/D, and drain electrode D may be spaced apart from the gate insulating pattern GP. The gate insulating pattern GP may be under the gate electrode G while overlapping the gate electrode G. The edge of the gate insulating pattern GP may coincide with the edge of the gate electrode G, and the gate insulating pattern GP and the gate electrode G may be the same size.

The semiconductor layer ACT may include a first region P1, and a second region P2 that may be thinner than the first region P1. The first region P1 of the semiconductor layer ACT may overlap the gate electrode G, the source electrode S, the source-drain electrode S/D, and the drain electrode D. The second region P2 of the semiconductor layer ACT may be between the source electrode S and the gate electrode G, and between the gate electrode G and the source-drain electrode S/D. Although not shown, the second region P2 of the semiconductor layer ACT may be between the gate electrode G and the drain electrode D.

The first region P1 of the semiconductor layer ACT may be a large-thickness region of the semiconductor layer ACT, in which at least a channel CHA of the semiconductor layer ACT may be located. For example, the first region P1 of the semiconductor layer ACT overlapping the gate insulating pattern GP may include a channel CHA, and the first region P1 may be larger in size than the gate insulating pattern GP. The large thickness of the channel CHA means that the channel CHA may be not damaged during the process. As such, the film uniformity of the channel CHA may be not deteriorated. Accordingly, deterioration of the characteristics of the semiconductor layer ACT may be prevented.

The second region P2 of the semiconductor layer ACT may be a region that may be thinner than the first region P1, whose thickness may be reduced due to etching during the process. The thickness d2 of the second region P2 may be about 30% to 70% of the thickness d1 of the first region P1. If the thickness d2 of the second region P2 is greater than or equal to about 30% of the thickness d1 of the first region P1, the movement of charges in the semiconductor layer ACT may be facilitated to improve the characteristics. If the thickness d2 of the second region P2 is less than or equal to about 70% of the thickness d1 of the first region P1, part of the gate insulating film may be left on the semiconductor layer ACT, thereby reducing or preventing the fabrication of unwanted thin-film transistors.

Figure 14A:
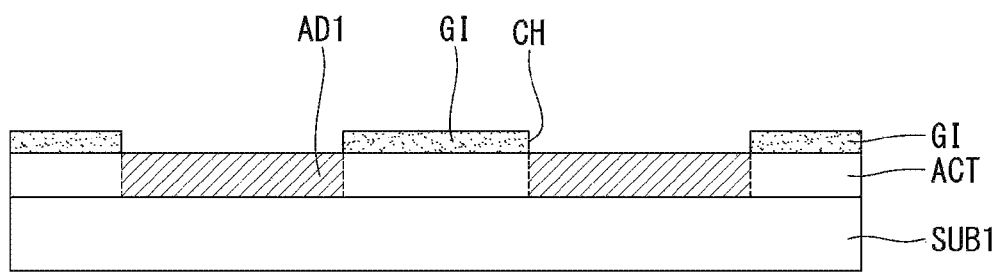
FIGS. 14A to 14C are cross-sectional views showing each process of a method for manufacturing a thin-film transistor according to an example embodiment of the present disclosure.
Figure 14B:
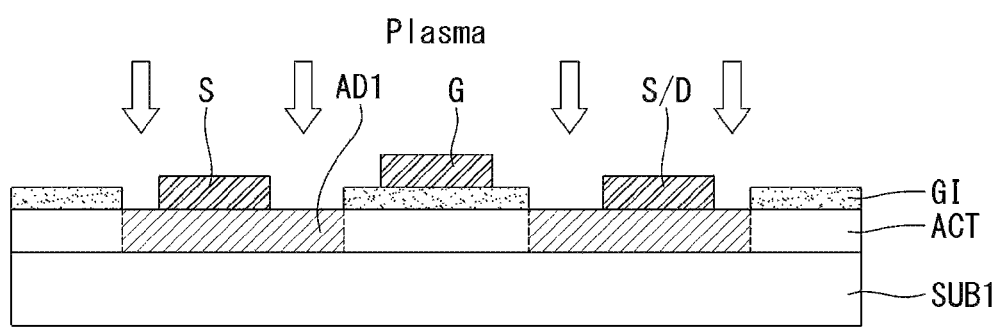
Figure 14C:
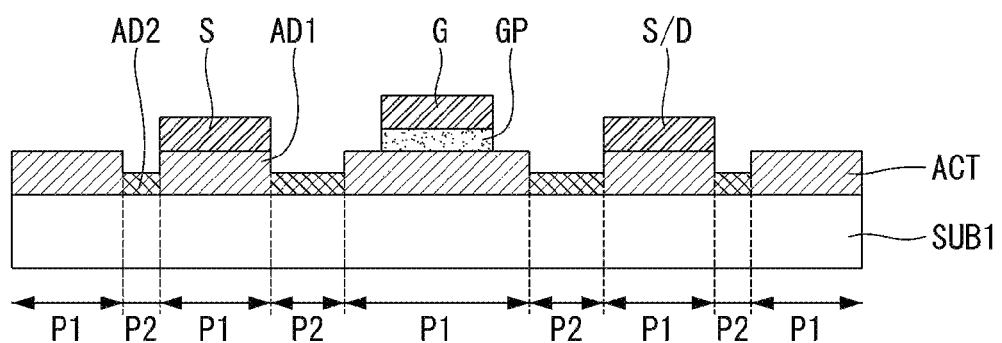

FIGS. 14A to 14C are cross-sectional views showing each process of a method for manufacturing a thin-film transistor according to an example embodiment of the present disclosure.

Hereinafter, the manufacturing process of thin-film transistors in the aforementioned buffer TFT portion will be described below with reference to FIGS. 14A to 14C. With reference to FIG. 14A, a semiconductor layer ACT may be formed on a substrate SUB1. The semiconductor layer ACT may include an oxide semiconductor. A gate insulating film GI may be deposited onto the entire surface of the substrate SUB1 where the semiconductor layer ACT may be formed. Also, a contact hole may be formed in a region where the source electrode and source-drain electrode are connected to the semiconductor layer ACT. Although not shown, a contact hole may also be formed in a region where the drain electrode may be connected to the semiconductor layer ACT. In a dry etching process in which the contact holes CH may be formed, the second semiconductor layer DACT may be doped with impurities, e.g., with plasma, thereby forming a first conductive region AD1.

Next, as shown in FIG. 14B, a gate electrode material may be deposited onto the substrate SUB1 where the gate insulating film GI may be formed, and then may be patterned to form a gate electrode G, a source electrode S, and a source-drain electrode S/D. Although not shown, a drain electrode D may be formed, as well.

The gate electrode material may include one or more of: molybdenum (Mo), aluminum (Al), chromium (Cr), gold (Au), titanium (Ti), nickel (Ni), neodymium (Nd), and copper (Cu), alloys of these elements, and/or alloys of these elements. Further, the gate electrode material may be a multilayer material, which may include two or more of: molybdenum (Mo), aluminum (Al), chromium (Cr), gold (Au), titanium (Ti), nickel (Ni), neodymium (Nd), copper (Cu), and/or alloys of these elements. For example, the gate electrode material may include dual layers of molybdenum and aluminum-neodymium or molybdenum and aluminum. Embodiments are not limited to these examples.

Thus, the source electrode S and the source-drain electrode S/D may directly contact with the semiconductor layer ACT. For example, the entire bottom surfaces of the source electrode S and source/drain electrode S/D may contact the top surface of the semiconductor layer ACT. Afterwards, the gate insulating film GI may be etched using the gate electrode G as a mask, thereby forming a gate insulating pattern GP that may overlap and may be only under the gate electrode G. All the other parts of the gate insulating film may be etched away and may be removed. In this case, the gate insulating pattern GP may be the same size as the gate electrode G.

Moreover, as shown in FIG. 14C, in the dry etching process, in which the gate insulating film may be etched, the exposed surface of the semiconductor layer ACT may be re-doped with impurities, e.g., with plasma, thereby forming a second conductive region AD2. In this case, due to the dry etching process, the exposed surfaces of the semiconductor layers ACT may be partially etched, thus causing a decrease in thickness. For example, the regions of the semiconductor layers ACT where the gate insulating film may be etched may be first regions, and the region of semiconductor layers ACT where the contact holes may be located, e.g., the externally exposed regions, may be second regions. Accordingly, the first regions P1 and second regions P2 of the semiconductor layers ACT may be formed, as shown in FIG. 13.

A thin-film transistor manufactured according to an example embodiment of the present disclosure may have an advantage of using fewer masks and improving productivity by forming a gate electrode, a source electrode, a source-drain electrode, and a drain electrode using a single mask. Another advantage of a thin-film transistor according to an example embodiment of the present disclosure may be that the film uniformity of the channel may be not damaged because over-etching of the semiconductor layer underlying the gate electrode may be reduced or prevented. Thus, deterioration of the characteristics of the thin-film transistor may be reduced or prevented.

As described above, a display device according to an example embodiment of the present disclosure may have an advantage of using fewer masks and improving productivity by forming a gate electrode, a source electrode, a source-drain electrode, and a drain electrode using a single mask. Moreover, a display device according to an example embodiment of the present disclosure may increase the contact area between the source and drain electrodes and the semiconductor layer because a gate insulating pattern may be formed only between the gate electrode and the semiconductor layer. Accordingly, the contact resistance between the semiconductor layer and the source and drain electrodes may be reduced, thus improving the characteristics of the thin-film transistor.

Furthermore, in a display device according to an example embodiment of the present disclosure, a semiconductor layer including an oxide in a thin-film transistor of a GIP driver may be made conductive, thereby manufacturing an oxide thin-film transistor. In addition, the film uniformity of the channel may be not damaged because over-etching of the semiconductor layer underlying the gate electrode may be reduced or prevented. Thus, deterioration of the characteristics of the thin-film transistor may be reduced or prevented.

It will be apparent to those skilled in the art that various modifications and variations may be made in the present disclosure without departing from the technical idea or scope of the disclosure. Thus, it is intended that embodiments of the present disclosure cover the modifications and variations of the disclosure provided they come within the scope of the appended claims and their equivalents.

What is claimed is:

1. A display device, comprising:
   a substrate;
   a semiconductor layer on the substrate;
   a gate insulating pattern on the semiconductor layer;
   a plurality of gate electrodes on the gate insulating pattern; and
   a thin-film transistor spaced apart from the gate insulating pattern, the thin-film transistor comprising:
      a source electrode contacting the top surface of the semiconductor layer;
      a source-drain electrode adjacent to the source electrode, a first of the plurality of gate electrodes being between the source-drain electrode and the source electrode; and a drain electrode adjacent to the source-drain electrode, a second of the plurality of gate electrodes being between the drain electrode and the source-drain electrode.

2. The display device of claim 1, wherein the gate insulating pattern is only under the plurality of gate electrodes.

3. The display device of claim 1, wherein the semiconductor layer comprises:
a first region; and
a second region having a thickness less than that of the first region.

4. The display device of claim 3, wherein the first region of the semiconductor layer overlaps the gate electrodes, the source electrode, the source-drain electrode, and the drain electrode.

5. The display device of claim 3, wherein the second region of the semiconductor layer is between the source electrode and the gate electrodes, between the gate electrodes and the source-drain electrode, and between the gate electrodes and the drain electrode.

6. The display device of claim 3, wherein the thickness of the second region is 30% to 70% of the thickness of the first region.

7. The display device of claim 3, wherein the first region of the semiconductor layer overlapping the gate insulating pattern is larger in size than the gate insulating pattern.

8. The display device of claim 1, wherein the thin-film transistor is in a gate-in-panel (GIP) driver of the display device.

9. The display device of claim 1, wherein the gate electrodes, the source electrode, the source-drain electrode, and the drain electrode comprise a gate electrode material.

10. A method for manufacturing a display device, the method comprising:
providing a semiconductor layer on a substrate;
providing a gate insulating film on the semiconductor layer;
depositing a gate electrode material on the substrate where the gate insulating film is provided;
forming a plurality of gate electrodes using a single mask;
providing a source electrode in contact with a first side of the semiconductor layer;
providing a drain electrode in contact with a second side of the semiconductor layer; and
providing a source-drain electrode between each of the plurality of gate electrodes.

11. The method of claim 10, further comprising:
forming contact holes exposing part of the semiconductor layer in the gate insulating film,
wherein the source electrode, the drain electrode, and the source-drain electrode contact the semiconductor layer via the contact holes.

12. The method of claim 10, further comprising:
forming a gate insulating pattern overlapping the gate electrodes by etching the gate insulating film using the gate electrodes as a mask; and
removing the gate insulating film, except for the gate insulating pattern.

13. The method of claim 12, wherein, in the forming of the gate insulating pattern:
the regions where the gate insulating film is etched are first regions; and
the regions where the contact holes are located are second regions.

14. The method of claim 13, wherein the second regions have a thickness less than that of the first regions.

* * * * *